United States Patent [19]
Yoshida et al.

[11] Patent Number: 5,409,275
[45] Date of Patent: Apr. 25, 1995

[54] MAGNETIC RETAINING DEVICE FOR ELECTRONIC APPARATUS

[75] Inventors: Norihiro Yoshida; Yukio Saito; Tomoyuki Nagamine; Takumi Kawamura; Masaki Okuyama, all of Inagi, Japan

[73] Assignee: Fujitsu Isotec Limited, Tokyo, Japan

[21] Appl. No.: 203,292

[22] Filed: Mar. 1, 1994

Related U.S. Application Data

[63] Continuation of Ser. No. 827,641, Jan. 29, 1992, Pat. No. 5,312,144.

[30] Foreign Application Priority Data

Mar. 19, 1991 [JP] Japan .................. 3-54974
Jun. 28, 1991 [JP] Japan .................. 3-158241

[51] Int. Cl.⁶ .......................................... E05C 17/56
[52] U.S. Cl. ................... 292/251.5; 220/230; 220/315; 361/679; 361/807; 24/303
[58] Field of Search ............... 292/251.5, 144; 361/679, 807; 24/303; 220/230, 315, 348, 326

[56] References Cited

U.S. PATENT DOCUMENTS

| | | |
|---|---|---|
| 2,219,186 | 10/1940 | Hornfeck . |
| 2,288,688 | 7/1942 | Dubilier . |
| 2,475,226 | 7/1949 | Ellis . |
| 2,586,900 | 2/1952 | Alderman . |
| 2,690,922 | 10/1954 | Teetor . |
| 2,693,382 | 11/1954 | Teetor . |
| 2,801,870 | 8/1957 | Davey ........................ 292/251.5 |
| 2,877,041 | 3/1959 | Foley . |
| 3,468,576 | 9/1969 | Beyer et al. .................. 220/230 |
| 3,716,091 | 2/1973 | Gaines ........................ 292/251.5 |
| 4,093,833 | 6/1978 | Tsukamoto . |
| 4,727,984 | 3/1988 | Bennardo .................... 220/230 |
| 4,986,417 | 1/1991 | Hsu . |
| 5,312,144 | 5/1994 | Yoshida et al. ............ 292/251.5 |

FOREIGN PATENT DOCUMENTS

| | | |
|---|---|---|
| 70861 | 10/1975 | Australia .................... 292/251.5 |
| 0467264 | 1/1992 | European Pat. Off. . |
| 1180547 | 6/1959 | France . |
| 1215185 | 4/1960 | France . |
| 1447441 | 6/1966 | France ....................... 292/251.5 |
| 1070061 | 11/1959 | Germany . |
| 2438312 | 2/1976 | Germany . |
| 629903 | 9/1949 | United Kingdom ........ 292/251.5 |
| 693564 | 7/1953 | United Kingdom ........ 292/251.5 |
| 730956 | 6/1955 | United Kingdom ........ 292/251.5 |
| 2205199 | 11/1988 | United Kingdom . |

*Primary Examiner*—Eric K. Nicholson
*Attorney, Agent, or Firm*—Staas & Halsey

[57] ABSTRACT

A retaining device for an electronic apparatus comprising a plurality of cases respectively containing individual component mechanisms of a small electronic apparatus, a magnet disposed in a recess formed in a surface of a first case among the plurality of cases; and a magnetic member provided on a second case among the plurality of cases. In this device, the magnet attracts the magnetic member to fix the respective positions of the first case and the second case relative to each other when the first case and the second case are set contiguously with the magnet and the magnetic member disposed opposite to each other.

8 Claims, 16 Drawing Sheets

MAGNETIC RETAINING DEVICE FOR ELECTRONIC APPARATUS

This application is a continuation of application Ser. No. 07/827,641, filed on Jan. 29, 1992, now U.S. Pat. No. 5,312,144.

BACKGROUND OF THE INVENTION

1. Field of the Invention

The present invention relates to a retaining device for an electronic apparatus, used for setting an electronic apparatus, such as a personal computer, a word processor or a printer for a personal computer or a word processor, in an operating position.

2. Description of the Related Art

Such a small electronic apparatus has individual internal mechanisms contained respectively in a plurality of cases, and the positions thereof relatively to each other can be changed for carrying or for operation. The plurality of cases must be fixed relative to each other, to thereby operate the small electronic apparatus.

When fixing the plurality of cases of such a small electronic apparatus relatively to each other, the conventional retaining device for an electronic apparatus employs a mechanical locking means or a magnetic means, including a permanent magnet attached to the surface of one of the plurality of cases and a magnetic member attached to the mating case and able to be attracted by the permanent magnet.

The mechanical locking mechanism, however, has a complex construction, increases the cost of the small electronic apparatus, and in most cases, increases the weight of the small electronic apparatus. Also, a mechanical locking mechanism having a simple construction typically is easily broken.

The utilization of the magnetic attraction of a permanent magnet, for fixing the cases relative to each other, enables a retaining device for an electronic apparatus to be given a compact, lightweight, and durable construction, at a reduced cost.

Recently, magnetic recording media, such as cash cards and floppy disks, have become widely used, but if such a magnetic recording medium is brought into direct contact with the permanent magnet of a retaining device for an electronic apparatus, the magnetic data recorded on the magnetic recording medium is destroyed.

SUMMARY OF THE INVENTION

Accordingly, an object of the present invention is to provide a low-cost retaining device for an electronic apparatus capable of solving the problems in the conventional retaining device for an electronic apparatus, employing magnetic attraction, having a compact, lightweight and durable construction, and eliminating the possibility of destroying the magnetic data recorded on a magnetic recording medium.

To achieve this object, the present invention provides a retaining device for an electronic apparatus comprising a plurality of cases respectively containing individual component mechanisms of a small electronic apparatus, a magnet disposed in a recess formed in the surface of the first case among the plurality of cases and a magnetic member provided on the second case among the plurality of cases, characterized in that the magnet attracts the magnetic member to fix the respective positions of the first case and the second case relatively to each other when the first case and the second case are set contiguously with the magnet and the magnetic member disposed opposite to each other.

The magnet may be fixed to the first case.

The magnetic member may be movable between a projected position at which the magnetic member is projected from the surface of the second case and a recessed position at which the same is positioned below the surface of the second case, and the second case may be provided with a stopper for limiting the length of the projection of the magnetic member from the second case to a value not greater than a predetermined value.

The magnetic member may be forced to project from the surface of the second case by a pushing means, and the magnetic member may be biased by a biasing means to be positioned below the surface of the second case.

The pushing means may be capable of being operated manually or the pushing means may be capable of automatically pushing the magnetic member so that the magnetic member projects from the surface of the second case when the first case and the second case are moved relatively to each other and the magnet and the magnetic member are thus disposed opposite to each other.

A further magnetic member may be placed on the surface of the first case between the magnet and the surface of the first case, and the magnet can be brought into contact with and separated from the further magnetic member.

The plurality of cases may be hinged by hinges.

DESCRIPTION OF THE PREFERRED EMBODIMENTS

Figure 1:
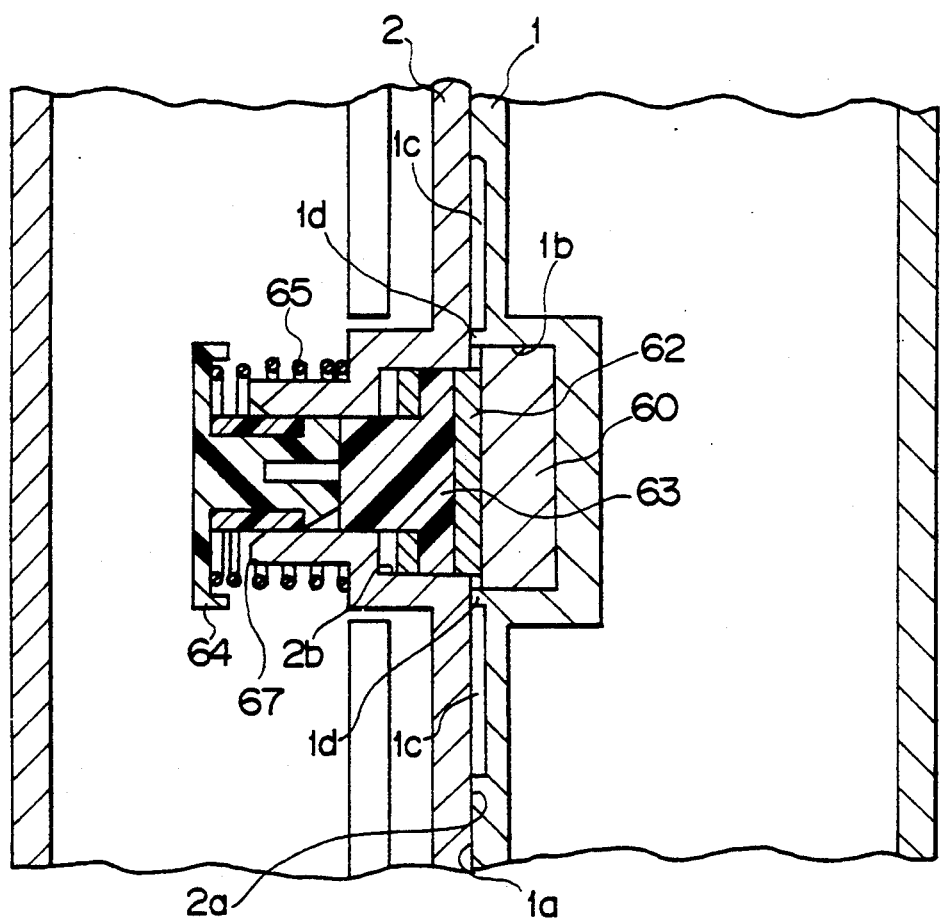
FIG. 1 is a fragmentary sectional view of a first embodiment in a joined state, according to the present invention.

Preferred embodiments of the present invention will be described hereinafter with reference to the accompanying drawings.

Note, throughout the drawings, the same reference characters are used to designate like or corresponding parts.

Figure 2:
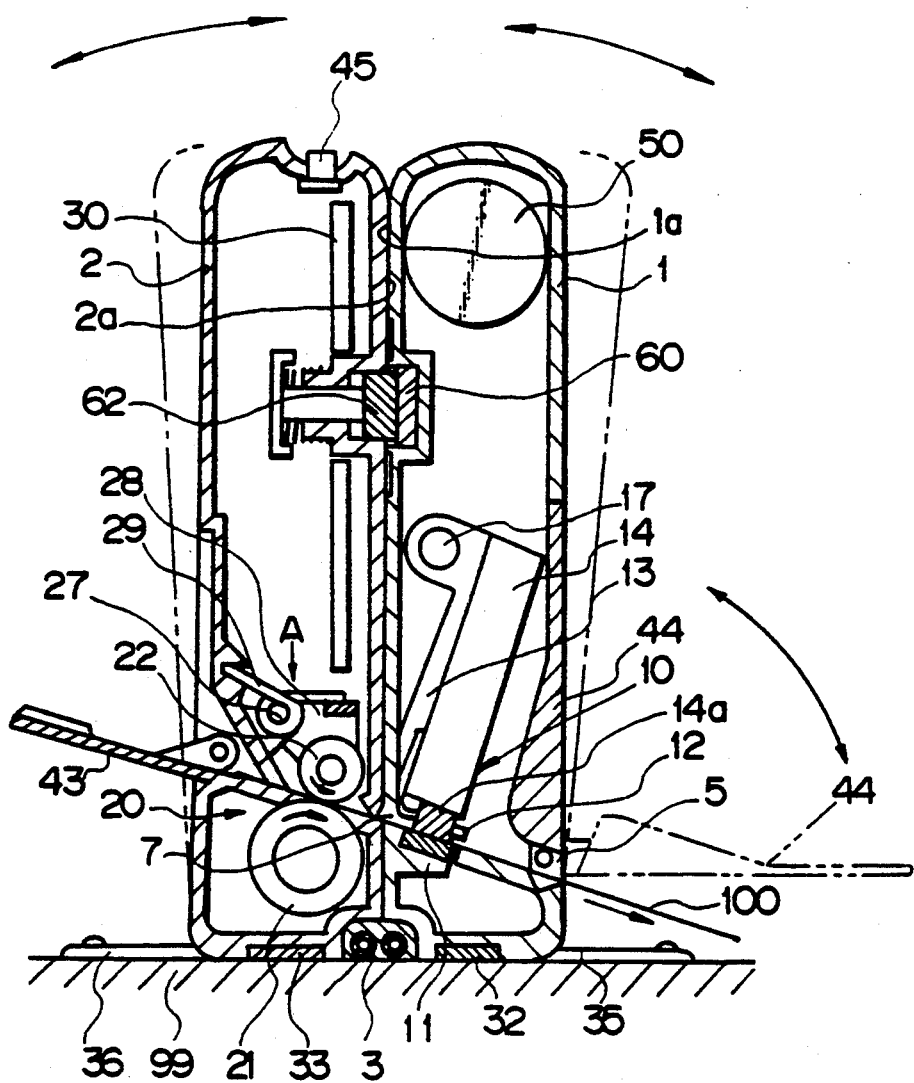
FIG. 2 is a sectional side view of a printer incorporating the first embodiment in an operating state.
Figure 3:
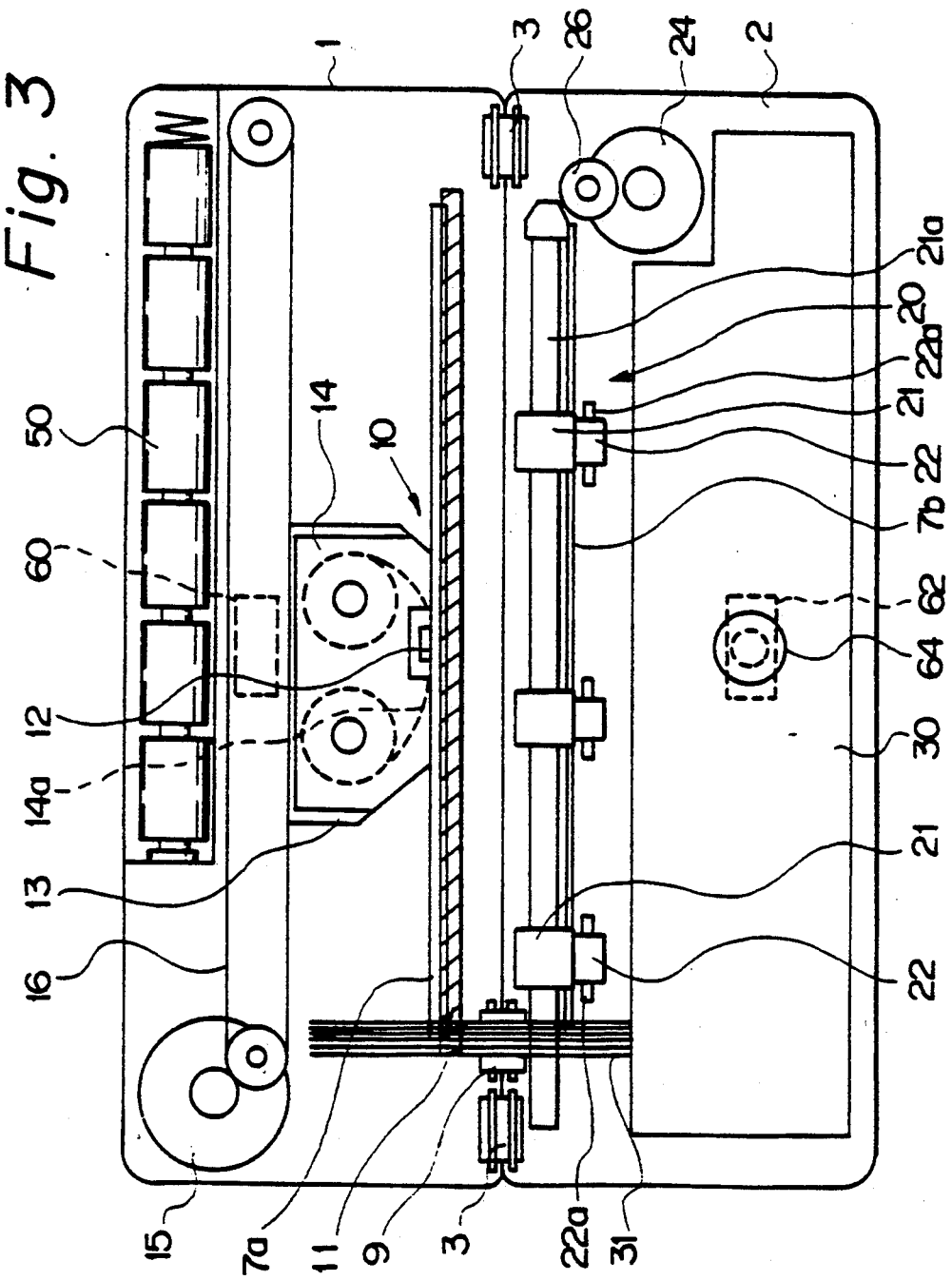
FIG. 3 is a schematic plan view of the printer incorporating the first embodiment in a carrying state.
Figure 4:
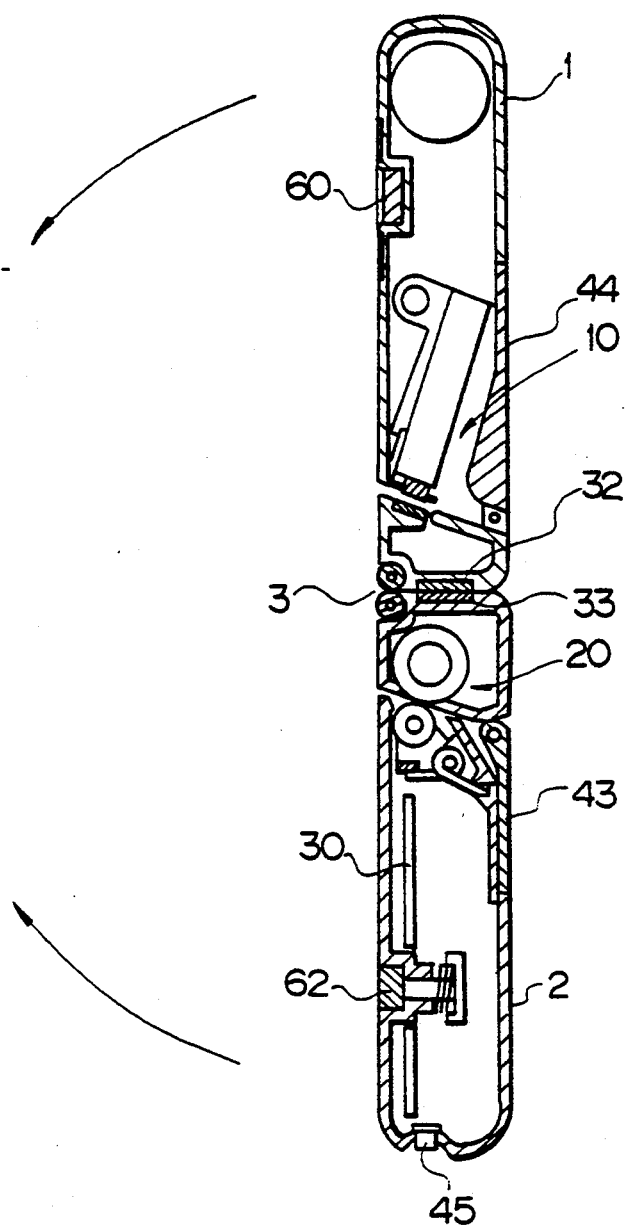
FIG. 4 is a sectional side view of the printer incorporating the first embodiment in a carrying state.

FIGS. 2 to 4 show a portable printer incorporating a retaining device for an electronic apparatus in a first embodiment according to the present invention. FIG. 2 shows the portable printer set in a folded state for printing, and FIGS. 3 and 4 show the portable printer in an unfolded and non-opening e.g. state for carrying, transportation or storage.

Referring to FIGS. 2 to 4, the portable printer has two individual cases, namely, a first case 1 and a second case 2. The two cases 1 and 2 are hinged by hinges 3 so as to be able to turn relatively to each other. The first case 1 contains a printing mechanism 10, a dry cell 50, and associated parts, and the second case 2 contains a sheet feed mechanism 20, a printed circuit board 30 provided with a control circuit, and associated parts.

As mentioned above, the printing mechanism 10 is contained in the first case 1. A flat platen 11 is placed in the first case 1, and a guide shaft 17 is fixedly placed so as to extend in parallel to the flat platen 11. A carriage 13 supported for sliding movement on the guide shaft 17 is driven through a drive belt 16 by a stepping motor 15 for reciprocation along the guide shaft 17.

A print head 12 is mounted on the carriage 13 opposite to the platen 11, and a ribbon cassette 14 is detachably mounted on the carriage 13 so that an ink ribbon 14a travels between the platen 11 and the print head 12.

When the carriage 13 is driven by the stepping motor 15, the print head 12 supported opposite to the platen 11 travels along the platen 11 for printing characters.

The sheet feed mechanism 20 is contained in the second case 2. Three pairs of sheet feed rollers 21 and 22 are supported respectively on rotary shafts 21a and 22a in the second case 2. The drive roller 21 is driven for rotation through rotary shaft 21a by a gear mechanism 26 in turn driven by a line feed motor 24.

The driven roller 22 is supported for rotation through rotary shaft 22a on arms 28 which turn on a shaft 27 in the second case 2. Rotary shaft 22a is shown truncated in FIG. 3 for the sake of clarity. The arms 28 are pressed by springs 29 in the direction of an arrow A (see FIG. 2), to press the driven roller 22 against the driving roller 21. The arms 28 and the springs 29 are not shown in FIG. 3.

The printed circuit board 30 fixedly provided within the second case 2 occupies a large space in the second case 2. Signals are transmitted through a flexible cable 31 to the spacing motor 15, the print head 12 and the line feed motor 24 from the control circuits formed on the printed circuit board 30. A main switch 45 of the portable printer is placed in a recess formed in the second case 2, so as to be positioned below the surface of the second case 2.

The first case 1 and the second case 2 containing these mechanisms are hinged by the pair of hinges 3 at the opposite ends thereof, for relatively turning on the hinges 3 such that they may be turned toward each other and away from each other.

When using the portable printer, namely, when printing on a print sheet 100 by the printing mechanism 10, the cases 1 and 2 are set with the respective wider surfaces 1a and 2a thereof joined together, as shown in FIG. 2. Hereinafter, this state of the portable printer will be referred to as a "folded state".

Figure 5:
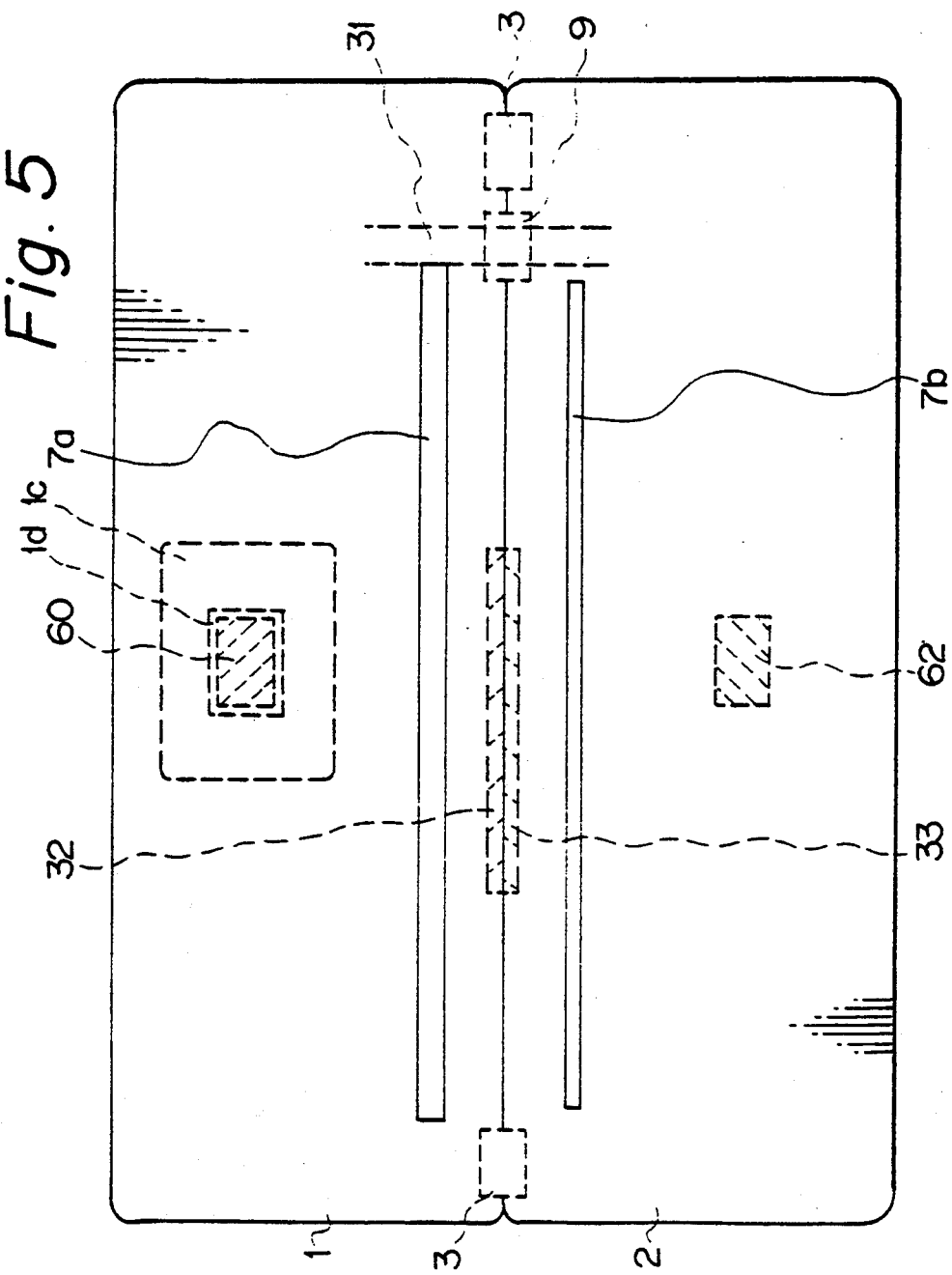
FIG. 5 is a rear elevational view of the printer of FIG. 3 in a carrying state.

When the portable printer is not used, namely, when carrying or transporting the portable printer, the portable printer can be opened through an angle of 180° so that the cases 1 and 2 extend in a plane as shown in FIGS. 3, 4, and 5. Since the cases 1 and 2 have substantially the same thickness, the portable printer can be opened to a flat shape of a size corresponding to, for example, a size A4. Accordingly, the portable printer can be held under the arm or put in a bag, to facilitate carrying and transporting the same, and the portable printer can be stored in a narrow space. This state of the portable printer will be referred to as the "unfolded state".

Figure 6:
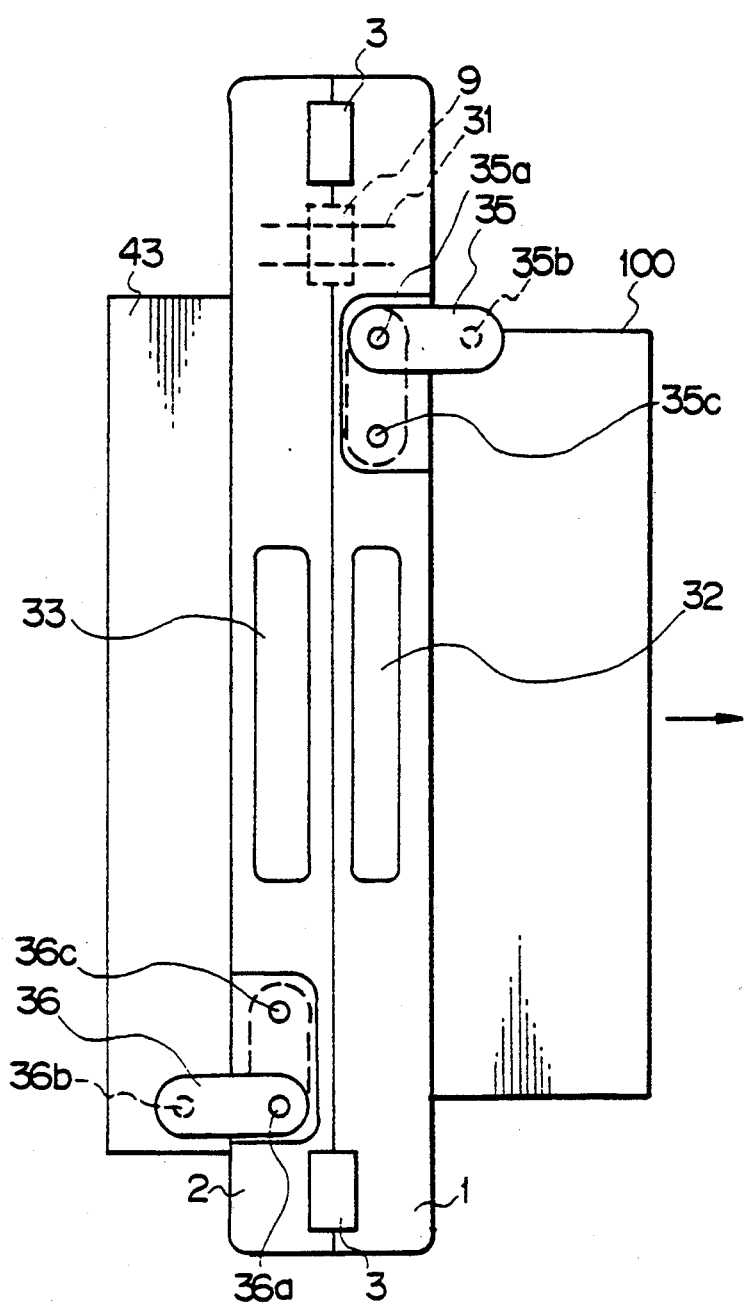
FIG. 6 is a bottom view of the printer of FIG. 2 in an operating state.

A permanent magnet 32 is fixed to one of the outer side surfaces (bottom surfaces in the folded state in FIG. 2) of the cases 1 and 2 that face each other in the unfolded state, and a steel plate 33 is fixed to the other outer surface. The permanent magnet 32 attracts the steel plate 33, to hold the cases 1 and 2 in the unfolded state when the portable printer is unfolded. The portable printer can be folded by applying a force exceeding a certain level to the cases 1 and 2. Indicated at 35 and 36 are feet joined respectively at location 35a and 36a to the bottom surfaces of the cases 1 and 2, i.e., the bottom surfaces in the folded state, so as to be turned through an angle of 90° (see FIG. 6). When not extended, the feet 35 and 35 lock in place with projections 35b and 36b fitting in recesses 35c and 36c, respectively.

A sheet transporting passage 7 along which the print sheet 100 is transported is formed so as to extend straight through the cases 1 and 2 in the folded state. The sheet transporting passage 7 is formed by slits 7a and 7b formed in cases 1 and 2, respectively, as shown in FIG. 3. A sheet guide plate 43 is supported for turning on the second case 2 at the inlet of the sheet transporting 10 passage 7. The sheet guide plate 43 can be opened to guide the print sheet 100 into the sheet transporting passage 7 for printing.

Figure 7:
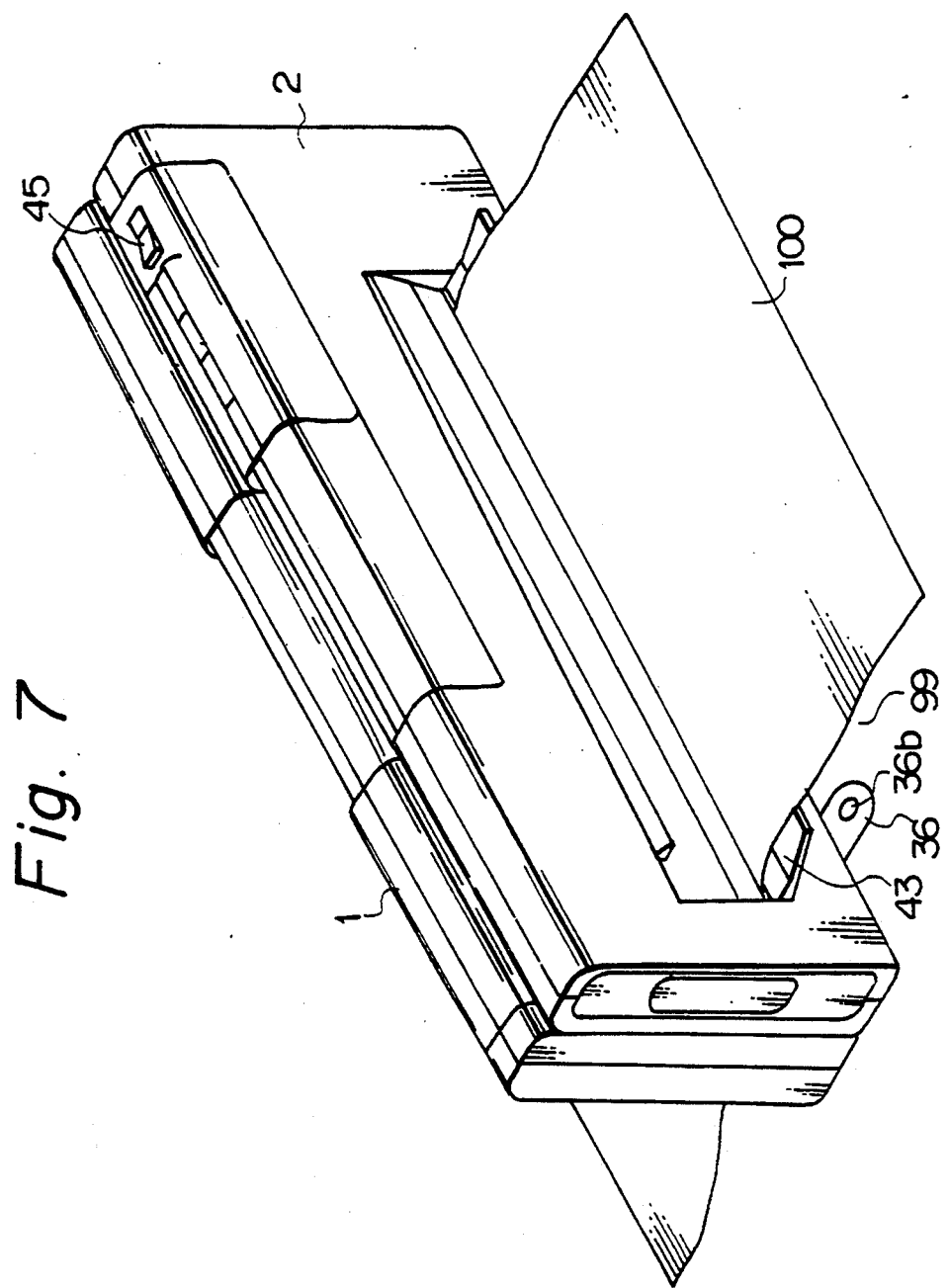
FIG. 7 is a perspective view of the printer incorporating the first embodiment, in an operating stare.

The sheet transporting passage 7 extends straight and is inclined downstream with respect to the sheet transporting direction. Therefore, the print sheet 100 can be smoothly discharged through an outlet 5 formed in the first case 1 onto the surface 99 of a table (see FIGS. 2 and 7).

In the folded state, the sheet feed mechanism 20 transports the print sheet 100 along the sheet transporting passage 7, and the printing mechanism 10 prints characters on the print sheet 100.

Figure 8:
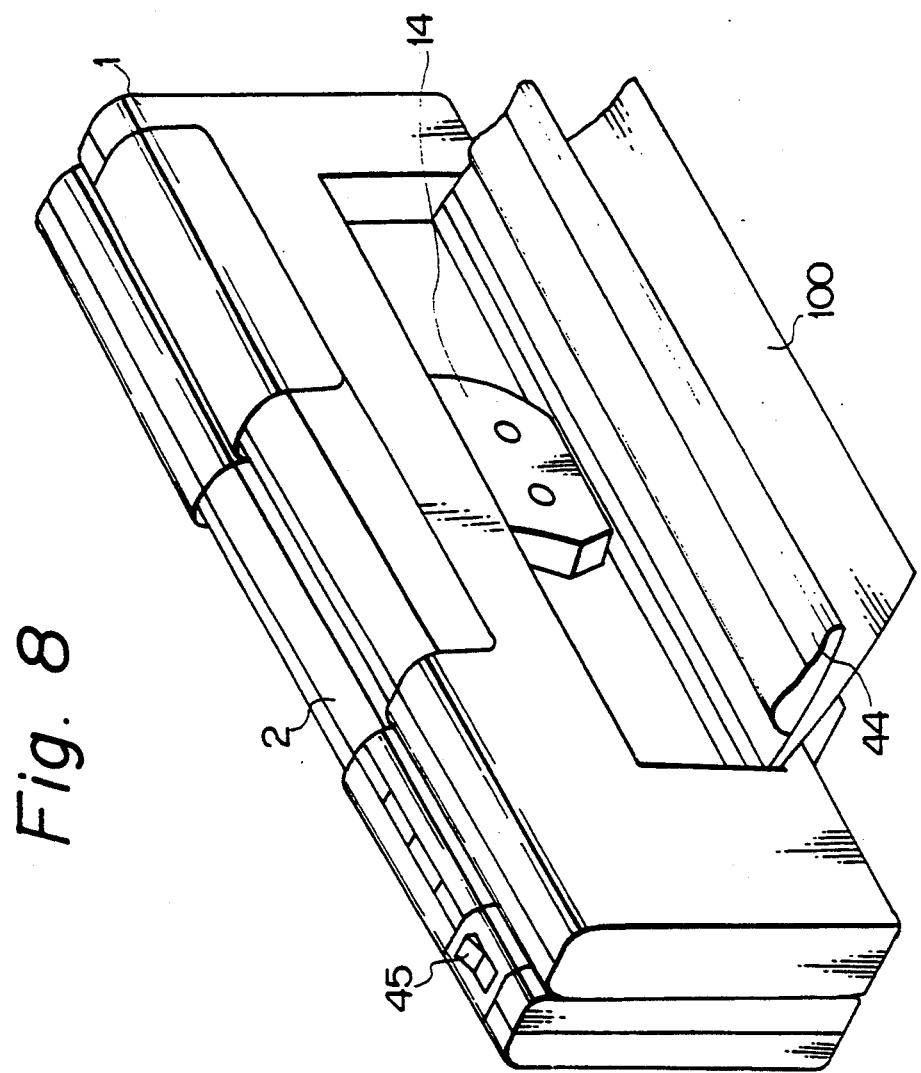
FIG. 8 is another perspective view of the printer of FIG. 2 when exchanging a ribbon cassette.

As can be seen in FIG. 8, a lid 44 is pivotally supported at its lower end on the outer surface of the first case 1. The lid 44 is opened to expose the ribbon cassette 14 in a large opening formed in the first case 1, to facilitate replacing a used ribbon cassette 14 with a new one. The outlet 5 is formed in the lower end of the lid 44.

Referring to FIG. 1 (and FIG. 9), a permanent magnet 60 and a steel plate (magnetic member) 62 are fixed respectively to the respective wider outer surfaces 1a and 2a of the cases 1 and 2, which are contiguous with each other in the folded state as shown in FIG. 2.

The permanent magnet 60 is placed in a recess 1b formed in the surface of the first case 1 and is attached to the first case 1. The permanent magnet 60 is positioned below the surface of the first case 1, to avoid direct contact of the permanent magnet 60 with a magnetic recording medium, such as a cash card or a floppy disk, in the unfolded state.

Figure 9:
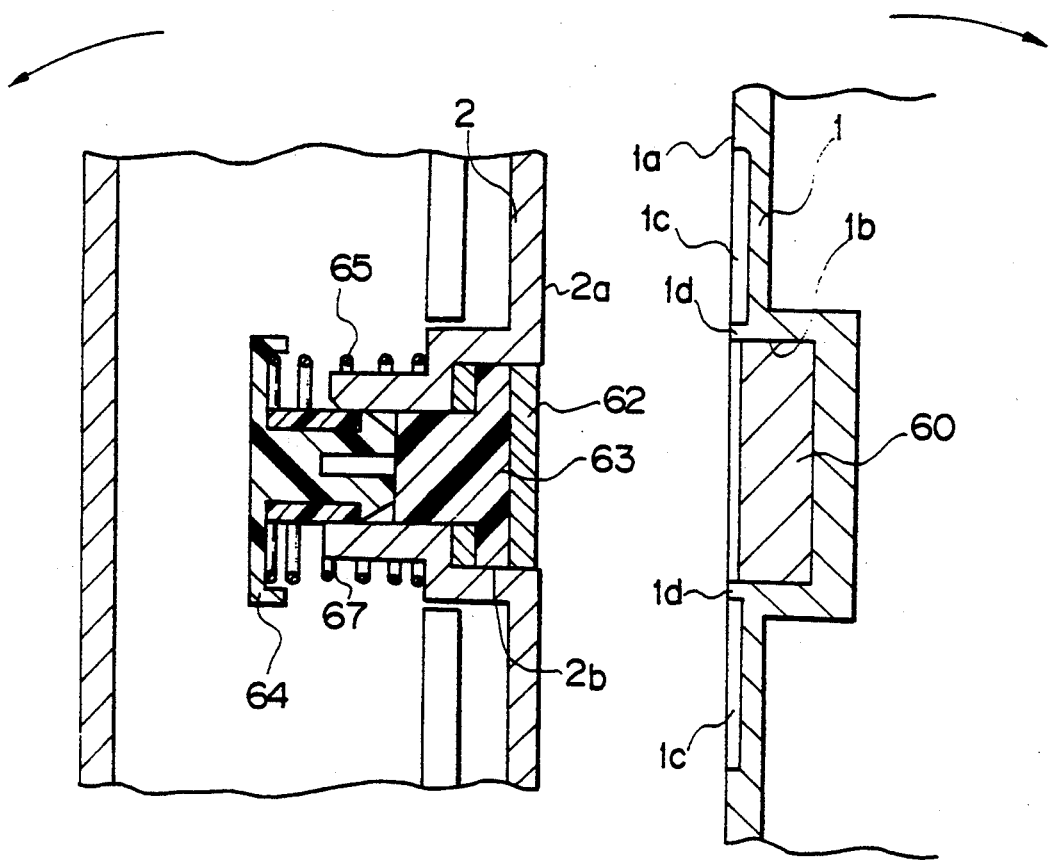
FIG. 9 is a partly enlarged fragmentary sectional view of the first embodiment, in a detached state.

Furthermore, in this first embodiment, as can be seen in FIGS. 1 and 9, there is also provided a relatively larger square looped recess 1c on the surface 1a of the first case 1, to a depth of about 0.5 mm, which is concentric with the recess 1b, while retaining a frame or wall 1d surrounding the recess 1b, which resembles a square looped partition (see FIG. 5).

The wall 1d, in addition to securing the position of the permanent magnet 60 below the surface 1a of the first case 1, makes it almost impossible for a magnetic recording medium (not shown) which for example slides on a flat surface of the square looped recess 1c, to come into direct contact with the permanent magnet 60 within the frame or wall 1d at the most important magnetic recorded portion thereof.

Further, it is not essential for the wall 1d to be continuous around the recess 1b.

The steel plate 62 is placed in a recess 2b formed in the surface 2a of the second case 2 so as to be located opposite to the permanent magnet 60 in the folded state. When the folded state as shown in FIG. 1, the permanent magnet 60 attracts the steel plate 62.

A stem 63 attached to the steel plate 62 is fitted loosely for axial movement in a hole formed in the central portion of the recess 2b of the second case 2. The extremity of the stem 63 is situated within the second case 2. A second stem attached to a spring bearing plate 64 having a large diameter is fixedly joined to the extremity of the stem 63.

A compression coil spring 65 having a comparatively small spring constant is extended between the spring bearing plate 64 and the second case 2, to bias the spring bearing plate 64, the stem 63 and the steel plate 62 integrally toward the interior of the second case 2.

When the cases 1 and 2 are not in the folded state, as shown in FIG. 9, the steel plate 62 is retracted into the recess 2b by the compression coil spring 65, so that the surface of the steel plate 62 is substantially flush with or positioned slightly below the surface of the second case 2, to avoid damage to other objects.

When the cases 1 and 2 are set in the folded state as shown in FIG. 1, the permanent magnet 60 attracts the 10 steel plate 62 against the resilience of the compression coil spring 65, so that the steel plate 62 projects from the surface of the second case 2.

If an external separating force is applied to the cases 1 and 2 in the folded state, the steel plate attracted to the permanent magnet 60 is pulled out from the second case 2 until the spring bearing plate 64 is brought into contact with a stopper 67 formed in the second case 2. Since the steel plate 62 is unable to project any further, the respective positions of the cases 1 and 2 relative to each other are fixed by the magnetic attraction acting between the permanent magnet 60 and the steel plate 62.

If an external force exceeding the magnetic attraction between the permanent magnet 60 and the steel plate 62 is applied to the cases 1 and 2, the steel plate 62 is separated from the permanent magnet 60, and then the steel plate 62 is retracted into the recess 2b of the second case 2 by the resilience of the compression coil spring 65.

Accordingly, the cases 1 and 2 are allowed to freely turn on the hinges 3, away from each other.

Figure 10:
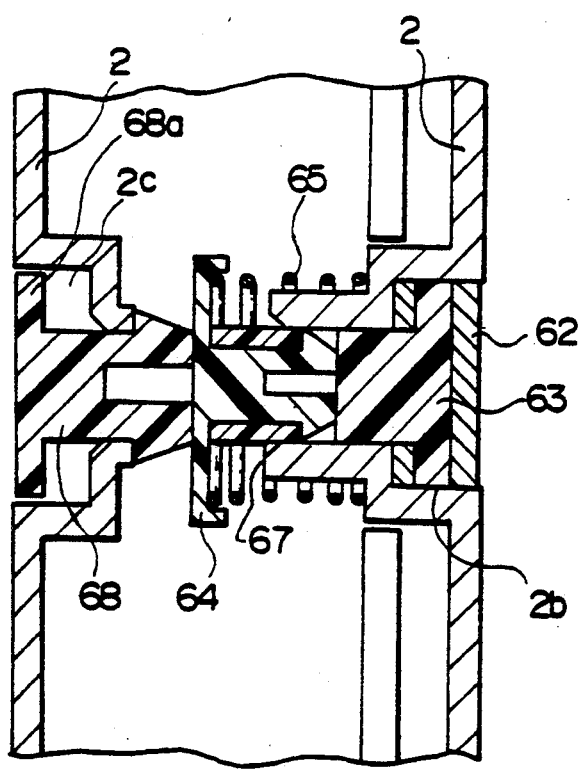
FIG. 10 is a partly enlarged fragmentary sectional view of one part of a second embodiment.
Figure 11:
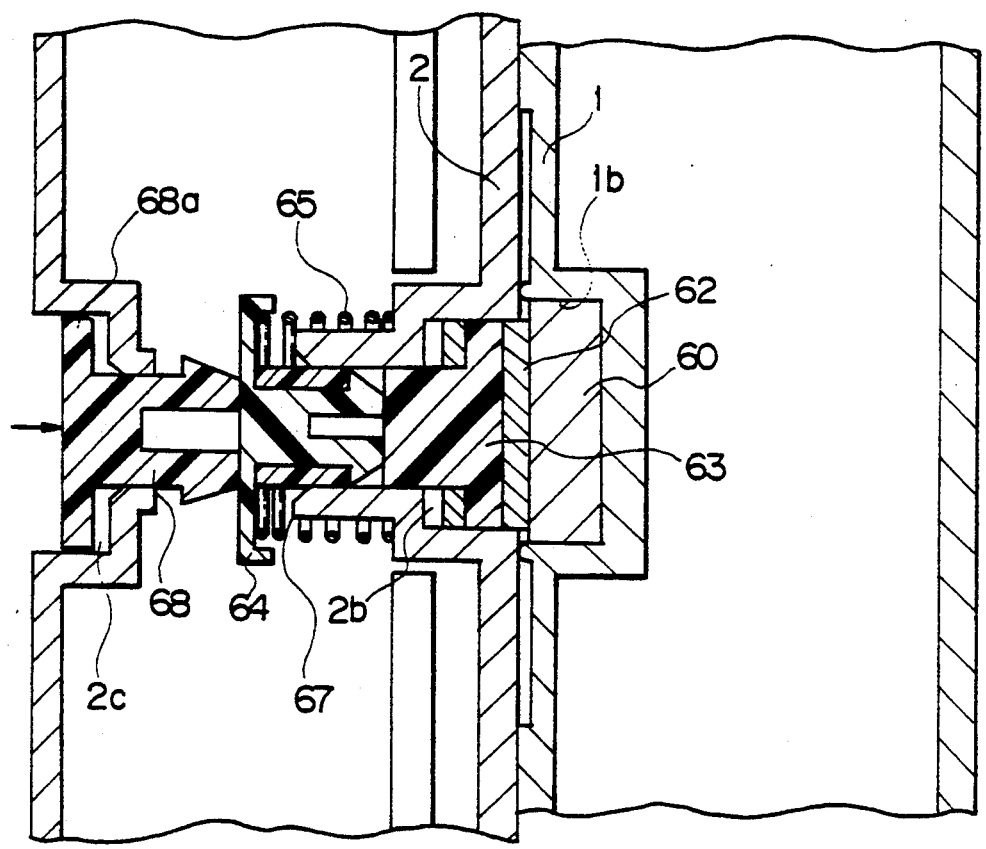
FIG. 11 is an enlarged fragmentary sectional view of the second embodiment in a joined state.

FIGS. 10 and 11 show a retaining device for an electronic apparatus in a second embodiment according to the present invention. This retaining device for an electronic apparatus is provided with a push button 68 that is operated by hand to forcibly push out a steel plate 62 from a recess 2b formed in a second case, against the resilience of a compression coil spring 65.

The front end of the push button 68 is in contact with the back surface of a spring bearing plate 64, and when pushed, the push button 68 pushes the spring bearing plate 64 against the resilience of the compression coil spring 65. The head 68a of the push button 68 is placed in a recess 2c formed in the second case 2 opposite to the recess 2b so that the head 68a is positioned below the surface of the second case 2 and can be reached from the outside.

Note, the permanent magnet 60 is positioned well below the surface 1a of the first case 1, to thus prevent any possible leakage of the magnetic flux from the recess 1b, and the steel plate 62 is kept stable in the recess 2b below the surface 2a of the second case 2, as shown in FIG. 10.

Accordingly, in this condition, when the cases 1 and 2 are Joined together in the folded state, the permanent magnet 60 can not come into contact with the steel plate 62.

To solve this problem, there is provided push button 68 and associated parts.

In this case, the push bottom 68 is depressed with the finger tip to push the steel plate 62 forcibly out of the recess 2b to a point at which the steel plate 62 is brought into close contact with the permanent magnet 60, as shown in FIG. 11. Then, the steel plate 62 is attracted to the permanent magnet 60 and, consequently, the first case 1 and the second case 2 are fixed relative to each other. The rest of the parts and construction of the retaining device for an electronic apparatus in the second embodiment are the same as those of the retaining device for an electronic apparatus in the first embodiment.

Figure 12:
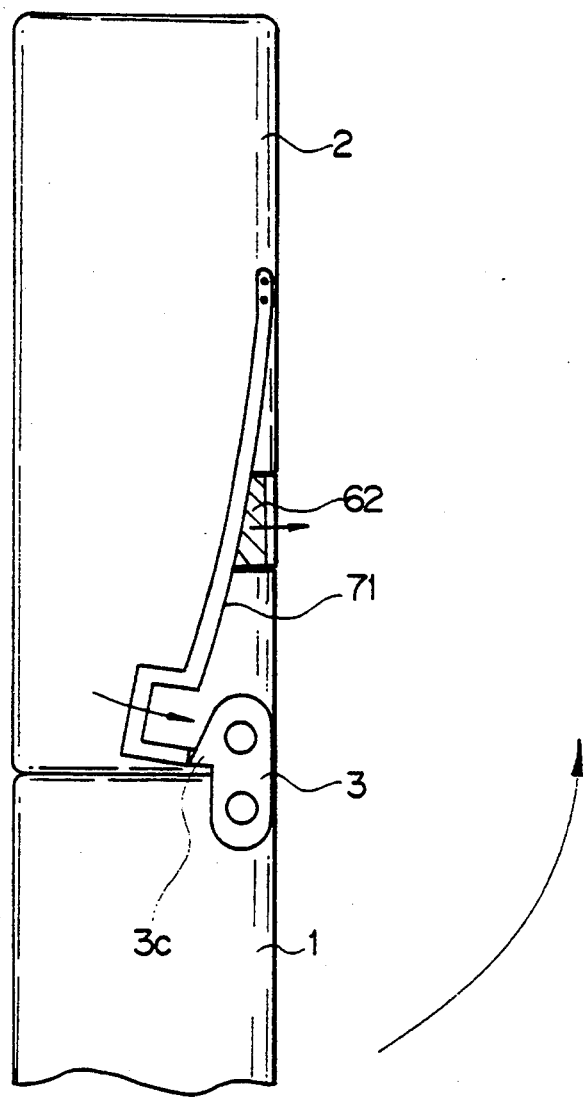
FIG. 12 is a schematic view of a third embodiment in an unfolded state.
Figure 13:
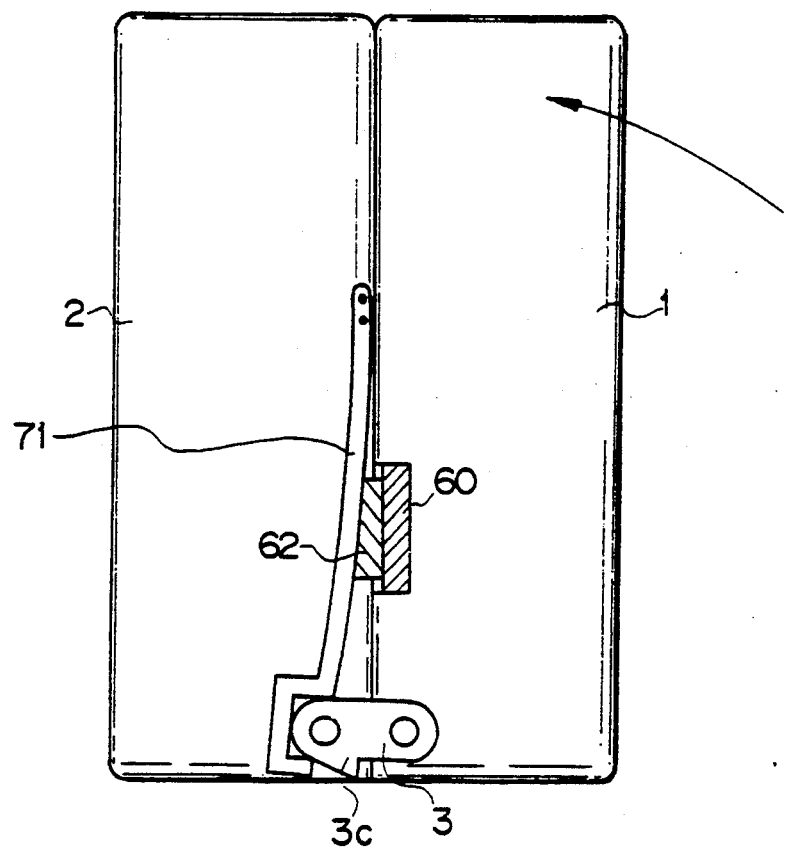
FIG. 13 is a schematic view of the third embodiment in a folded state.

FIG. 12 and 13 show a third embodiment of the present invention. The third embodiment is-provided with a cam 3c formed on the outer surface of a hinge 3, and a flat spring 71 fixedly holding a steel plate 62 and having a free end engaging the cam 3c.

The flat spring 71 is provided within a second case 2. In the unfolded state, the free end of the flat spring 71 is pushed by the cam 3c , so that the flat spring 71 is strained in a large curvature to hold the steel plate 62 positioned below the surface of the second case 2 as shown in FIG. 12. A permanent magnet 60 is fixed to a first case so that the same is positioned below the surface of the first case 1.

When the cases 1 and 2 are joined together in the folded state, the free end of the flat spring 71 is disengaged from the cam 3c and the curvature of the flat spring 71 is reduced as shown in FIG. 13. Consequently, the steel plate 62 projects from the surface of the second case to enable the permanent magnet 60 to attract the steel plate 62.

Thus, in this third embodiment, the steel plate 62 is projected from and retracted into the second case automatically, according to the movement of the second case 2 relative to the first case 1.

Figure 14:
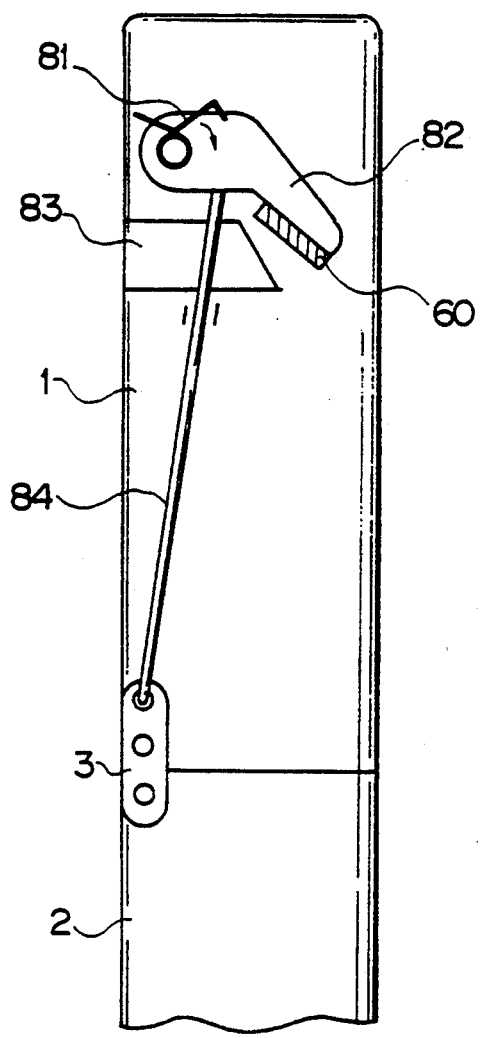
FIG. 14 is a schematic view of a fourth embodiment in an unfolded state.
Figure 15:
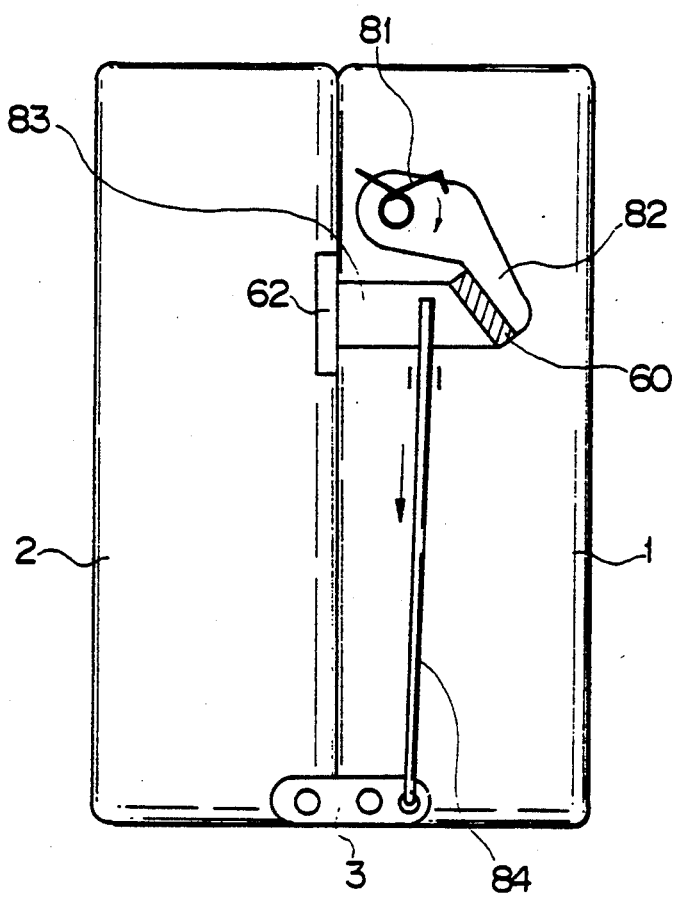
FIG. 15 is a schematic view of the fourth embodiment in a folded state.

FIGS. 14 and 15 show a fourth embodiment of the present invention. A movable arm 82 is supported pivotally in a first case 1 and is biased clockwise by a torsion spring 81. A permanent magnet 60 is secured to the free end of the movable arm 82. The permanent magnet 60 can be brought into contact with and separated from a yoke (magnetic member) 83 having one end exposed outside.

In this embodiment, an elongated rod 84 connected to a hinge 3 supports the movable arm 82, to keep the permanent magnet 60 separated from the yoke 83 as shown in FIG. 14 in the unfolded state. Accordingly, articles outside the first case 1 are not affected by the magnetic field of the permanent magnet 60 in the unfolded state.

When the cases 1 and 2 are joined together in the folded state, as shown in FIG. 15, the rod 84 is pulled down as the hinge 3 turns and releases the movable arm 82. Then, the torsion spring 81 turns the movable arm 82 to bring the permanent magnet 60 into contact with the yoke 83 and, consequently, a steel plate 62 fixed to the second case 2 is attracted to the yoke 83 by the magnetism of the permanent magnet 60.

Thus, in the fourth embodiment, the permanent magnet 60 provided within the first case 1 comes into contact with and separates from the yoke 83 according to the movement of the first case 1 relative to the second case 2. Therefore, in the unfolded state, articles outside the cases 1 and 2 are not affected by the magnetic field of the permanent magnet 60.

The present invention is by no means limited to the specific embodiments as illustrated and described herein, and it is clear that various modifications thereof may be made which come within the scope of the present invention as defined in the appended claims.

In the foregoing embodiments, for example, the magnet and the magnetic member may be interchanged. In any case, the permanent magnet 60 must be positioned below the surface of the case 1 or 2 and, preferably, the steel plate 62 does not project from the surface of the case 2 or 1 in the unfolded state.

The present invention is applicable to various electronic apparatuses including personal computers and word processors, as well as the portable printer.

Figures 16A, 16B:
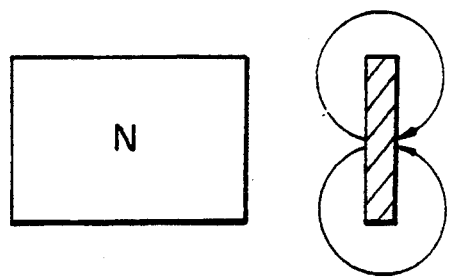
FIGS. 16(a) and 16(b) show one type of permanent magnet.
Figures 17A, 17B:
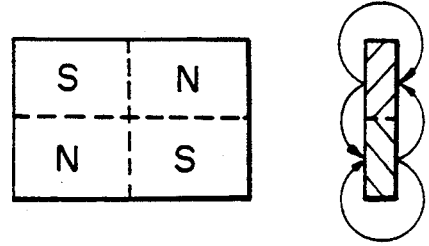
FIG. 17(a) and 17(b) show another type of permanent magnet.

Further, the following description encompasses various modifications of the permanent magnet 60, with reference to FIGS. 16(a), 16(b), 17(a) and 17(b). FIGS. 16(b) and 17(b) side views of 16(b) and 17(a), respectively.

The flat rectangular magnet of FIGS. 16(a) and 16(b) has the usual magnet pole arrangement, the center portion of which has smaller magnetic attraction.

On the other hand, the of magnet of FIGS. 17(a) and 17(b) is of the same shape as that of FIGS. 16(a) and 16(b), but has 4 magnetic poles on both sides. It is preferable to use the latter type rather than the former, as a smaller leakage of the magnetic flux from the recess occurs when the latter type is used.

From the foregoing, it can be seen that the retaining device for an electronic apparatus in accordance with the present invention fixes the plurality of cases relative to each other by the magnetic 10 attraction of the magnet, and thus the retaining device for an electronic apparatus can be readily given a compact, lightweight and durable construction at a reduced cost. Since the magnet is positioned below the surface of the case, magnetic data recorded on a magnetic recording medium cannot be destroyed when the magnetic recording medium is brought into contact with the case.

We claim:

1. A retaining device, comprising:
    first and second cases pivotably connected along respective lateral edges thereof for being selectively pivoted between open and closed positions relatively to each other;
    a magnet positioned in a recess formed in a surface of the first case so that at least when the first and second cases are in the open position, the magnet cannot damage a magnetic recording medium located within a proximity of a portion of the surface of the first case where the recess is formed;
    a magnetic member provided on the second case in a position complementary to the position of the magnet in the first case, at least one of the magnet and the magnetic member being movable to an operating position when the first and second cases are in the closed position so as to be mutually attracted and thereby to produce a magnetic force which assists in maintaining the first and second cases in the closed position, the magnetic member being selectively movable to a projected position at which the magnetic member projects from a surface of the second case and a recessed position at which the magnetic member is positioned below the surface of he second case; and
    pushing means for pushing the magnetic member from the recessed position to the projected position, the magnetic member being forced to project from the surface of the second case by said pushing means.

2. A retaining device according to claim 1, wherein said pushing means is manually operable.

3. A retaining device according to claim 1, wherein said pushing means automatically pushes said magnetic member to the projected position and so that said magnetic member projects from the surface of the second case when the first case and the second case are moved relatively to each other to the closed position and said magnet and said magnetic member are thus disposed opposite to each other in the complementary positions thereof.

4. A retaining device according to claim 1, further comprising biasing means wherein said magnetic member is biased by biasing means to be positioned below the surface of the second case.

5. A retaining device, comprising:
    first and second cases pivotably connected along respective lateral edges thereof for being selectively pivoted between open and closed positions relatively to each other;
    a magnet positioned in a recess formed in a surface of the first case so that at least when the first and second cases are in the open position, the magnet cannot damage a magnetic recording medium located within a proximity of a portion of the surface of the first case where the recess is formed;
    a magnetic member provided on the second case in a position complementary to the position of the magnet in the first case, at least one of the magnet and the magnetic member being movable to an operating position when the first and second cases are in the closed position so as to be mutually attracted and thereby to produce a magnetic force which assists in maintaining the first and second cases in the closed position, the magnetic member being selectively movable to a projected position at which the magnetic member projects from a surface of the second case and a recessed position at which the magnetic member is positioned below the surface of the second case, the second case being provided with a stopper for limiting the extent Of the projection of the magnetic member from the surface of the second case to an amount not greater than a fixed amount; and pushing means, the magnetic member being forced to project from the surface of the second case by said pushing means.

6. A retaining device, comprising:

first and second cases pivotably connected along respective lateral edges thereof for being selectively pivoted between open and closed positions relatively to each other;

a magnet positioned in a recess formed in a surface of the first case so that at least when the first and second cases are in the open position, the magnet cannot damage a magnetic recording medium located within a proximity of a portion of the surface of the first case where the recess is formed;

a magnetic member provided on the second case in a position complementary to the position of the magnet in the first case, at least one of the magnet and the magnetic member being movable to an operating position when the first and second cases are in the closed position so as to be mutually attracted and thereby to produce a magnetic force which assists in maintaining the first and second case in the closed position, the magnetic member being selectively movable to a projected position at which the magnetic member projects from a surface of the second case and a recessed position at which the magnetic member is positioned below the surface of the second case, the second case being provided with a stopper for limiting the extent of the projection of the magnetic member from the surface of the second case to an amount not greater than a fixed amount:

pushing means for pushing the magnetic member from the recessed position to the projected position, the magnetic member being forced to project from the surface of the second case by said pushing means: and biasing means, said magnetic member being biased by biasing means to be positioned below the surface of the second case.

7. A retaining device, comprising:

first and second cases pivotably connected along respective lateral edges thereof for being selectively pivoted between open and closed positions relatively to each other;

a magnet positioned in a recess formed in a surface of the first case so that at least when the first and second cases are in the open position, the magnet cannot damage a magnetic recording medium located within a proximity of a portion of the surface of the first case where the recess is formed;

a magnetic member provided on the second case in a position complementary to the position of the magnet in the first case, at least one of the magnet and the magnetic member being movable to an operating position when the first and second cases are in the closed position so as to be mutually attracted and thereby to produce a magnetic force which assists in maintaining the first and second cases in the closed position, the magnetic member being selectively movable to projected position at which the magnetic member projects from a surface of the second case and a recessed position at which the magnetic member is positioned below the surface of the second case;

pushing means for pushing the magnetic member from the recessed position to the projected position, the magnetic member being forced to project from the surface of the second case by said pushing means, said pushing means being manually operable; and biasing means for biasing said magnetic member to the recessed position below the surface of the second case.

8. A retaining device, comprising:

first and second cases pivotably connected along respective lateral edges thereof for being selectively pivoted between open and closed positions relatively to each other;

a magnet positioned in a recess formed in a surface of the first case so that at least when the first and second cases are in the open position, the magnet cannot damage a magnetic recording medium located within a proximity of a portion of the surface of the first case where the recess is formed;

a magnetic member provided on the second case in a position complementary to the position of the magnet in the first case, at least one of the magnet and the magnetic member being movable to an operating position when the first and second cases are in the closed position so as to be mutually attracted and thereby to produce a magnetic force which assists in maintaining the first and second cases in the closed position, the second case being provided with a stopper for limiting the extent of the projection of the magnetic member from the surface of the second case to an amount not greater than a fixed amount; and pushing means for pushing the magnetic member from the recessed position to the projected position, the magnetic member being forced to project from the surface of the second case by the pushing means, said pushing means being manually operable.

* * * * *

UNITED STATES PATENT AND TRADEMARK OFFICE
CERTIFICATE OF CORRECTION

PATENT NO. : 5,409,275
DATED : April 25, 1995
INVENTOR(S) : Norihiro YOSHIDA et al.

It is certified that error appears in the above-indentified patent and that said Letters Patent is hereby corrected as shown below:

<u>Title Page,</u> item [75] change "Inagi" to --Tokyo--; and
item [57], line 5, delete ";" after "cases".

<u>Col. 1,</u> line 36, insert "," before and after "typically";
line 41, delete "," after "tion"; and
line 52, delete "10".

<u>Col. 2,</u>
line 65, ·"FIGS." starts a new paragraph.

<u>Col. 3,</u> line 13, after "folded" insert --and thus operating--;
line 15, change "non-opening e.g. state" to --non-operating state, e.g.--;

<u>Col. 4,</u> line 40, delete "10".
<u>Col. 5,</u> line 23, after "When" insert --in--.
<u>Col. 6,</u> line 23, after "provided" insert --the--;
line 37, change "FIG." to --FIGS.--; and
line 38, change "is-provided" to --is provided--.

UNITED STATES PATENT AND TRADEMARK OFFICE
CERTIFICATE OF CORRECTION

PATENT NO. : 5,409,275
DATED : April 25, 1995
INVENTOR(S) : Norihiro Yoshida et al It is certified that error appears in the above-indentified patent and that said Letters Patent is hereby corrected as shown below:

Col. 7, line 46, delete "of" (first occurrence); and
line 55, delete "10"

Col. 8, Line 68, change "Of" to —of—.

Signed and Sealed this

Tenth Day of October, 1995

BRUCE LEHMAN

Attest:

Attesting Officer

Commissioner of Patents and Trademarks